(12) United States Patent
Lee

(10) Patent No.: US 8,451,663 B2
(45) Date of Patent: May 28, 2013

(54) METHOD OF PROGRAMMING NONVOLATILE MEMORY DEVICE INCLUDING FIRST AND SECOND SENSE OPERATIONS IN PROGRAM LOOP

(75) Inventor: Ji-Sang Lee, Iksan-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 108 days.

(21) Appl. No.: 13/053,343

(22) Filed: Mar. 22, 2011

(65) Prior Publication Data

US 2011/0305081 A1    Dec. 15, 2011

(30) Foreign Application Priority Data

Jun. 10, 2010    (KR) ................. 10-2010-0054652

(51) Int. Cl.
 *G11C 11/34* (2006.01)
 *G11C 16/34* (2006.01)
 *G11C 16/28* (2006.01)

(52) U.S. Cl.
 CPC .......... *G11C 16/3454* (2013.01); *G11C 16/28* (2013.01)
 USPC .............................. 365/185.22; 365/185.21

(58) Field of Classification Search
 USPC .............. 365/185.21 X, 185.22 O, 185.21, 365/185.22
 See application file for complete search history.

(56) References Cited

U.S. PATENT DOCUMENTS

| | | | | |
|---|---|---|---|---|
| 6,888,758 | B1* | 5/2005 | Hemink et al. | 365/185.22 |
| 7,379,342 | B2* | 5/2008 | Park et al. | 365/185.22 |
| 7,813,188 | B2* | 10/2010 | Won et al. | 365/189.05 |
| 2008/0094912 | A1* | 4/2008 | Incarnati et al. | 365/185.22 |
| 2008/0117688 | A1* | 5/2008 | Park et al. | 365/185.22 |
| 2008/0316820 | A1* | 12/2008 | Seol et al. | 365/185.03 |
| 2009/0285020 | A1* | 11/2009 | Park et al. | 365/185.03 |
| 2009/0285024 | A1* | 11/2009 | Kang | 365/185.03 |
| 2010/0259993 | A1* | 10/2010 | Kang | 365/185.03 |

FOREIGN PATENT DOCUMENTS

| | | |
|---|---|---|
| JP | 11096774 A | 4/1999 |
| KR | 1020070000525 A | 1/2007 |

* cited by examiner

*Primary Examiner* — Vanthu Nguyen
(74) *Attorney, Agent, or Firm* — Volentine & Whitt, PLLC

(57) ABSTRACT

A method of programming a nonvolatile memory device comprises programming target memory cells among a plurality of memory cells connected to a wordline, performing a first sensing operation on the plurality of memory cells, and selectively performing a second sensing operation on the target memory cells based on a result of the first sensing operation.

20 Claims, 10 Drawing Sheets

METHOD OF PROGRAMMING NONVOLATILE MEMORY DEVICE INCLUDING FIRST AND SECOND SENSE OPERATIONS IN PROGRAM LOOP

CROSS-REFERENCE TO RELATED APPLICATIONS

This application claims priority under 35 U.S.C. §119 to Korean Patent Application No. 10-2010-0054652 filed on Jun. 10, 2010, the disclosure of which is hereby incorporated by reference in its entirety.

BACKGROUND OF THE INVENTION

Embodiments of the inventive concept relate generally to semiconductor memory devices. More particularly, embodiments of the inventive concept relate to methods of programming nonvolatile memory devices and related methods of verifying programmed nonvolatile memory cells.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power.

A nonvolatile memory device can operate in different modes to perform different operations. For instance, a nonvolatile memory device can operate in a program mode to perform a program operation, a read mode to perform a read operation, or an erase mode to perform an erase operation.

A flash memory device, which is one type of nonvolatile memory device, performs erase operations in units of memory blocks or sectors, and performs program operations in units of pages. Flash memory devices can be divided into subclasses according to configurations of their memory cell arrays. These subclasses include, for instance, NAND flash memory devices in which cell transistors are coupled in series between a bitline and a source line and NOR flash memory devices in which cell transistors are coupled in parallel between a bitline and a source line. In a flash memory device, a program operation changes respective threshold voltages of selected memory cells by applying predetermined voltages to the selected memory cells.

Researchers continue to develop additional forms of nonvolatile memory with improved storage capacity, performance, and lower power consumption. Examples of these additional forms of nonvolatile memory include phase change random access memory (PRAM), resistive random access memory (RRAM), and magnetic random access memory (MRAM).

In flash memory and some other types of nonvolatile memory, a verification operation is performed after a program operation to determine whether the program operation was successful. For example, in an incremental step pulse programming (ISPP) operation of a flash memory device, a program operation and a verification operation are performed on selected memory cells in each of several loops until the verification operation indicates that the selected memory cells are successfully programmed. To ensure accurate programming, the verification operation must be able to correctly determine program states of the selected memory cells. In addition, to avoid slow programming, the verification operation must be performed efficiently.

SUMMARY OF THE INVENTION

According to one embodiment of the inventive concept, a method of programming a nonvolatile memory device comprises programming target memory cells among a plurality of memory cells connected to a wordline, performing a first sensing operation on the plurality of memory cells, and selectively performing a second sensing operation on the target memory cells based on a result of the first sensing operation.

According to another embodiment of the inventive concept, a method of programming target memory cells connected to a selected wordline in a nonvolatile memory device comprises performing a plurality of program loops each comprising applying a program pulse to the target memory cells via the selected wordline, performing a first program verification operation to verify program states of memory cells connected to the selected wordline, and selectively performing a second program verification operation to verify program states of memory cells connected to the selected wordline. The second program verification operation is performed as a consequence of determining, in the first program verification operation, that at least one off-cell exists among the target memory cells.

These and other embodiments of the inventive concept can improve the efficiency of program operations performed by nonvolatile memory devices.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, the terms first, second, third, etc., are used to describe various features, but these features should not be limited by these terms. Rather, these terms are used merely to distinguish between different features.

Accordingly, a first feature could alternatively be termed a second feature without departing from the scope of the inventive concept. As used herein, the term "and/or" encompasses any and all combinations of one or more of the associated listed items.

Where a feature is referred to as being "connected" or "coupled" to another element, it can be directly connected or coupled to the other feature or intervening features may be present. In contrast, where a feature is referred to as being "directly connected" or "directly coupled" to another element, there are no intervening features present. Other words used to describe the relationship between features should be interpreted in a like fashion (e.g., "between" versus "directly between," "adjacent" versus "directly adjacent," etc.).

The terminology used herein is for the purpose of describing example embodiments only and is not intended to limit the inventive concept. The singular forms "a," "an," and "the" are intended to encompass the plural forms as well, unless the context clearly indicates otherwise. The terms "comprises" and/or "comprising" indicate the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and will not be interpreted in an idealized or overly formal sense unless expressly so defined herein.

Figure 1:
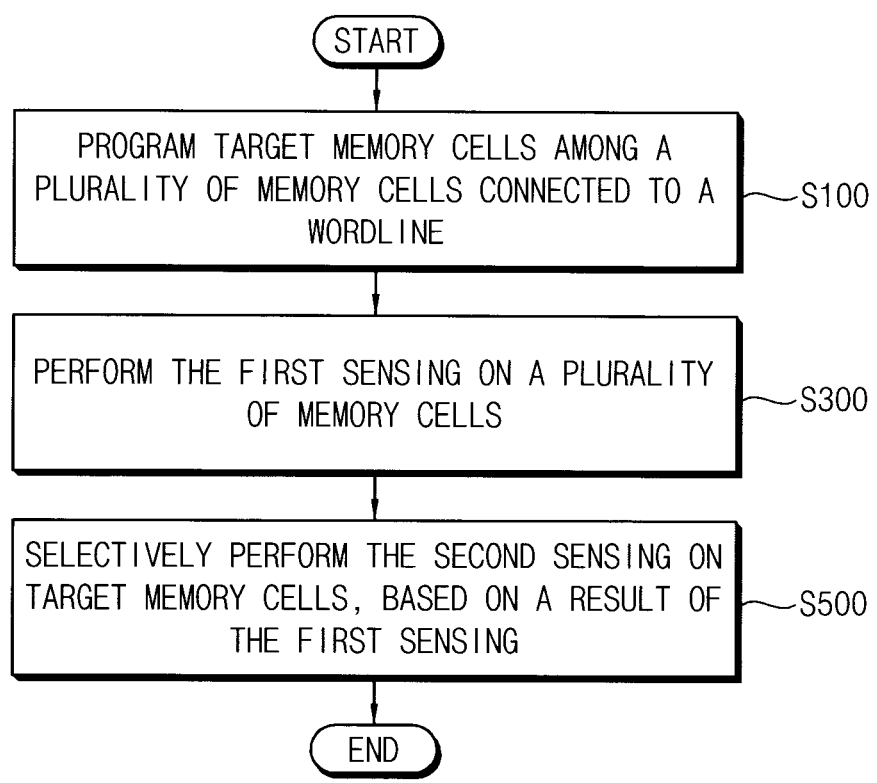
FIG. 1 is a flowchart illustrating a method of programming a nonvolatile memory device according to an embodiment of the inventive concept.

FIG. 1 is a flowchart illustrating a method of programming a nonvolatile memory device according to an embodiment of the inventive concept.

Referring to FIG. 1, the method begins by programming target memory cells among a plurality of memory cells connected to a selected wordline and selected bitlines (S100). For example, in a flash memory device, the target memory cells are programmed by applying a program voltage to the selected wordline and applying program permission or program inhibition voltages to the selected bitlines.

Next, a first sensing operation is performed on the plurality of memory cells after the target memory cells are programmed (S300). Then, a second sensing operation is selectively performed on the target memory cells based on a result of the first sensing operation (S500).

The first sensing operation determines whether each of the plurality of memory cells is an on-cell or an off-cell. The second sensing operation determines whether the target memory cells are completely programmed.

An on-cell corresponds to a memory cell that is turned on due to its relatively low threshold voltage where a verification voltage is applied to the selected wordline. An off-cell corresponds to a memory cell that is turned off due to its relatively high threshold voltage where the verification voltage is applied to the selected wordline. The first sensing operation is performed on all of the plurality of memory cells. The second sensing operation is performed only on target memory cells. By using the first sensing operation and the selective second sensing operation in combination, the verification of the target memory cells can be performed with substantial accuracy.

In some embodiments, the second sensing operation is skipped based on the result of the first sensing operation. The second sensing operation can be skipped, for instance, where the first sensing operation determines that there are no off-cells among the target memory cells. The second sensing operation can be performed where the first sensing operation determines that at least one off-cell exists among the target memory cells.

Figure 2:
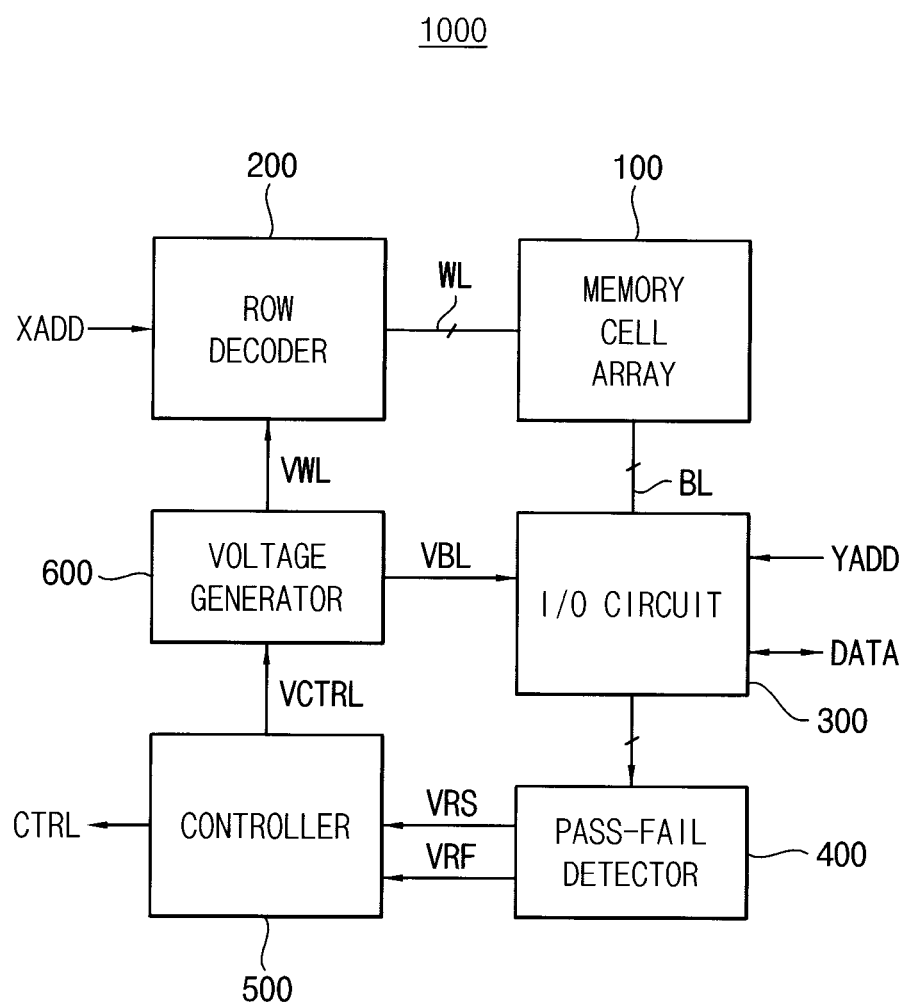
FIG. 2 is a block diagram illustrating a nonvolatile memory device according to an embodiment of the inventive concept.

FIG. 2 is a block diagram illustrating a nonvolatile memory device 1000 according to an embodiment of the inventive concept.

Referring to FIG. 2, nonvolatile memory device 1000 comprises a memory cell array 100, a row decoder 200, an input/output (I/O) circuit 300, a pass-fail detector 400, a controller 500, and a voltage generator 600.

Memory cell array 100 comprises a plurality of memory cells, where each memory cell is connected to a corresponding wordline WL and bitline BL. Cell transistors are coupled in series between a bitline and a source line in a NAND flash memory device, and cell transistors are coupled in parallel between a bitline and a source line in a NOR flash memory device.

Row decoder 200 selects a wordline based on a row address XADD and selects a plurality of memory cells with the selected wordline. In a program mode, a program voltage and a verification voltage are sequentially applied to the selected wordline. In a read mode, a read voltage is applied to the selected wordline. Such voltages applied to a wordline are generated by voltage generator 600 in response to a voltage control signal VCTRL provided from controller 500.

I/O circuit 300 comprises a column decoder for selecting a bitline based on a column address YADD, a sense amplifier for sensing and amplifying a voltage of the bitline, and a driver for applying voltages depending on program data to respective bitlines. I/O circuit 300 performs a programming operation and a reading operation in response to a control signal CTRL provided from controller 500. In the program mode, I/O circuit 300 loads data provided from an external device and applies program permission voltages or program inhibition voltages to each of bitlines based on the program data. Accordingly, target memory cells to be programmed are coupled to the selected wordline and to bitlines receiving the program permission voltage.

Verification is performed after programming the target memory cells to determine whether the target memory cells are successfully programmed. Verification including the first sensing operation and the second sensing operation will be described in detail with reference to FIGS. 3 through 12. In the read mode, I/O circuit 300 outputs read data by detecting voltages of bitlines.

Where verification is performed during the program mode, pass-fail detector 400 generates a first detection signal VRS indicating whether at least one off-cell exists among the target memory cells and a second detection signal VRF indicating whether the target memory cells are completely programmed. The operation and configuration of pass-fail detector 400 will be described in further detail with reference to FIGS. 8, 9, and 10.

Controller 500 generates control signal CTRL to control the operation of nonvolatile memory device 1000 and voltage control signal VCTRL to control voltage generator 600. Control signal CTRL comprises a bitline precharge signal BLPRE and a latch signal LAT. Where nonvolatile memory device 1000 performs a program operation using ISPP, voltage control signal VCTRL includes information about controlling the number of pulses, a generation timing of pulses, and a level of a start pulse. Controller 500 determines, based on first detection signal VRS, whether to perform the second sensing operation. Controller 500 determines, based on second detection signal VRF, whether programming is completed with respect to the target memory cells.

Voltage generator 600 generates a wordline voltage VWL and a bitline voltage VBL in response to voltage control signal VCTRL. Wordline voltage VWL applied to row decoder 200 comprises a wordline program voltage, a verification voltage, and a read voltage. Bitline voltage VBL applied to I/O circuit 300 comprises a program permission voltage, a program inhibition voltage, a precharge voltage, and a reference voltage.

Figure 3:
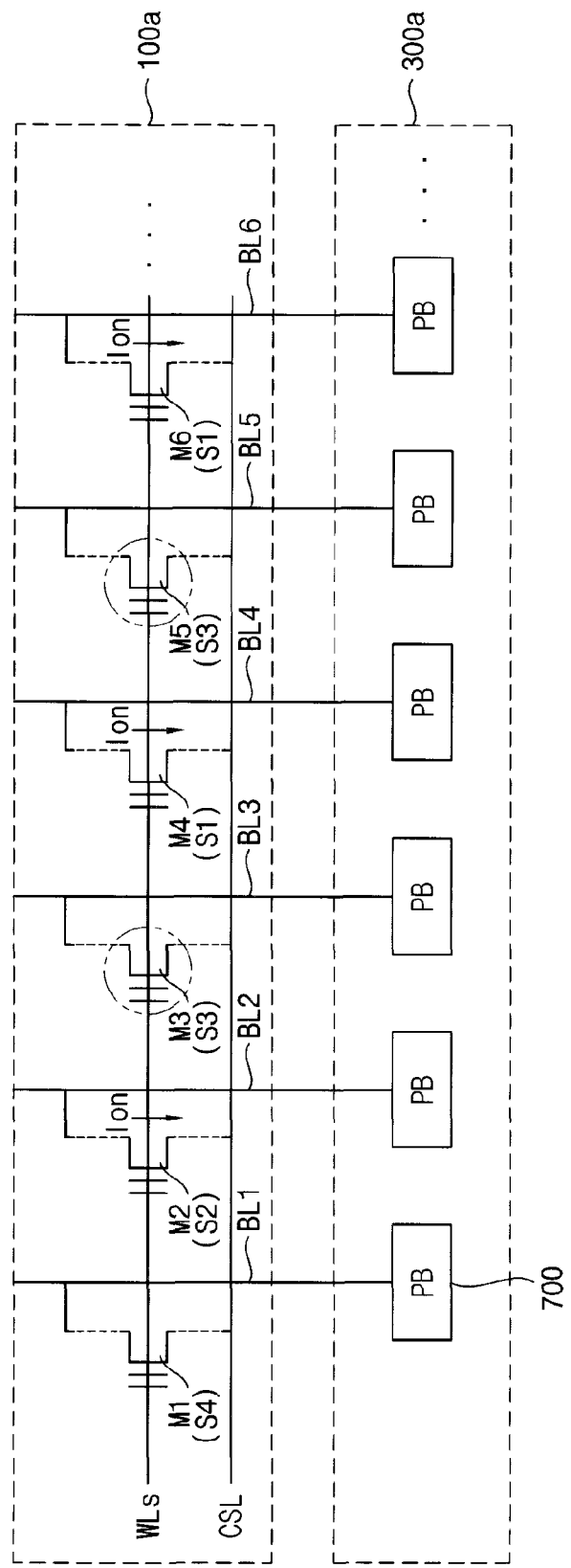
FIG. 3 is a diagram illustrating an example memory cell array configuration for the nonvolatile memory device of FIG. 2.
Figure 4:
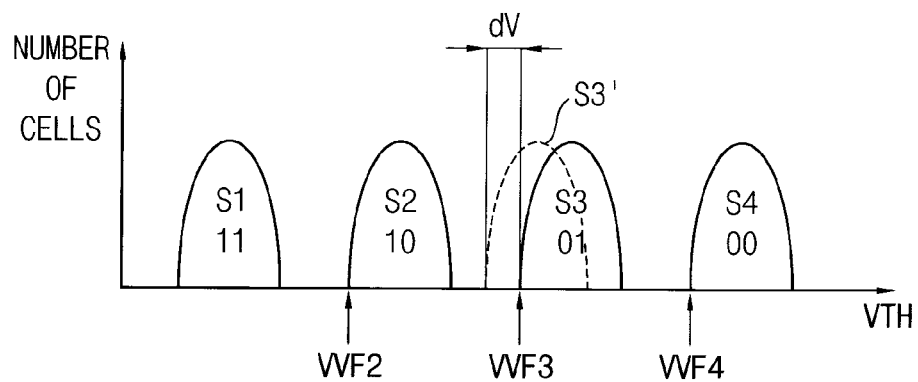
FIG. 4 is a diagram illustrating an example of program states of memory cells in the nonvolatile memory device of FIG. 2.

FIG. 3 is a diagram illustrating an example memory cell array configuration for nonvolatile memory device 1000 of FIG. 2. FIG. 4 is a diagram illustrating an example of program states of memory cells in nonvolatile memory device 1000 of FIG. 2.

In the example of FIG. 3, nonvolatile memory device 1000 is a flash memory device comprising a memory cell array 100a. Memory cell array 100a comprises a plurality of flash memory cells respectively arranged at intersections of wordlines and bitlines. For convenience of description, FIG. 3 shows only six memory cells M1 through M6, with control gates of memory cells M1 through M6 commonly connected to a selected wordline WLs.

Memory cells M1 through M6 are coupled between a common source line CSL and respective bitlines BL1 through BL6. Memory cell array 100a can be a NOR type or a NAND type memory cell array. In the NOR type flash memory device, only one memory cell M1 is coupled between bitline BL1 and common source line CSL. In the NAND type flash memory device, a NAND string comprising selection transistors and a plurality of memory cells is coupled between bitline BL1 and common source line CSL. Dotted lines drawn between the bitline and the memory cell and between the memory cell and the common source line indicate that memory cell array 100a can be either a NOR type or a NAND type memory cell array.

An I/O circuit 300a comprises a plurality of page buffer units 700 that perform program and read operations. Page buffer units 700 are connected to respective bitlines BL1 through BL6. In other words, nonvolatile memory device 1000 has an all-bitline configuration in which each of several sense amplifiers is connected to a corresponding bitline.

In different embodiments, memory cells M1 through M6 of FIG. 3 can be single-level cells (SLCs) each storing only one bit, or multi-level cells (MLC) each storing two or more bits. In the description that follows, it will be assumed that each of memory cells M1 through M6 is configured to store two bits of data.

Memory cells M1 through M6 can store two bits each by representing stored data using four distinct threshold voltage distributions as shown in FIG. 4. A lowest threshold voltage distribution corresponds to a first state S1 representing data '11', or an erased state. Other threshold voltage distributions correspond to a second state S2 representing data '10', a third state S3 representing data '01', and a fourth state S4 representing data '00'.

After a memory cell is programmed to one of states S2, S3, and S4, a verification operation is performed using a corresponding verification voltage VVF2, VVF3, or VVF4. For example, as illustrated in FIGS. 3 and 4, it is assumed that fourth memory cell M4 and sixth memory cell M6 are in first state 51, second memory cell M2 is in second state S2, third memory cell M3 and fifth memory cell M5 are in third state S3, and first memory cell M1 is in fourth state S4. Where third state S3 is currently to be programmed and verified, third memory cell M3 and fifth memory cell M5 correspond to target memory cells. Where precharge voltages are applied to the bitlines BL1 through BL6, a ground voltage is applied to the common source line and third verification voltage VVF3 is applied to selected wordline WLs, and memory cells M2, M4, and M6 having threshold voltages lower than third verification voltage VVF3 are turned on. Consequently, turn-on currents $I_{on}$ flow through bitlines connected to memory cells M1, M2, and M3 to the common source line. Such turn-on currents $I_{on}$ increase a common source line voltage and affect verification of target memory cells M3 and M5.

Due to the increase in the common source line voltage, the threshold voltages of target memory cells M3 and M5 may be incorrectly determined to be in third state S3 even where the threshold voltages of target memory cells M3 and M5 are actually distributed in a state S3'. In other words, due to noise generated on the common source line, memory cells having threshold voltages distributed within an interval dV may be identified as off-cells even though the memory cells are actually on-cells having threshold voltages lower than third verification voltage VVF3. Such a phenomenon tends to occur more frequently at the beginning of programming operation because many on-cells exist in state 51. To address this problem, certain embodiments of the inventive concept perform the first sensing operation, followed by selective performance of the second sensing operation.

The second sensing operation is selectively performed, as will be described in further detail below. The second sensing operation is skipped where it is determined based on the first sensing operation that an off-cell does not exist among target memory cells M3 and M5, and the second sensing operation is performed where it is determined based on the first sensing operation that an off-cell exists among target memory cells M3 and M5. The first sensing operation is used to determine whether each of memory cells M1 though M6 commonly coupled to selected wordline WLs is an on-cell or an off-cell, and the second sensing operation is used to determine whether target memory cells M3 and M5 are completely programmed. The first sensing operation is performed on all of memory cells M1 through M6, and the second sensing operation is performed only on target memory cells M3 and M5. In some embodiments, the second sensing operation is performed only on memory cells identified by the first sensing operation as off-cells among the target memory cells M3 and M5.

Figure 5:
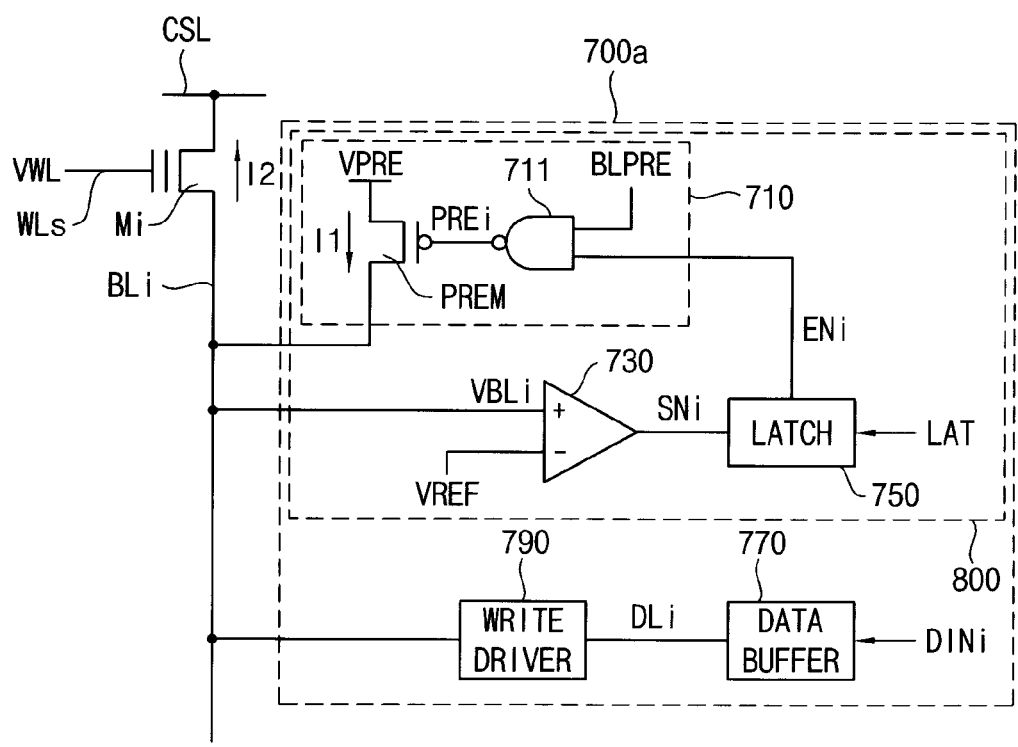
FIG. 5 is a diagram illustrating an example of a page buffer unit in the nonvolatile memory device of FIG. 2.

FIG. 5 is a diagram illustrating an example of a page buffer unit in nonvolatile memory device 1000 of FIG. 2.

Referring FIG. 5, a page buffer unit 700a comprises a sense amplifier 800, a data buffer 770, and a program driver 790. Sense amplifier 800 comprises a precharge circuit 710, an amplifier 730, and a latch circuit 750.

Data DINi to be written in a memory cell Mi is temporarily stored in data buffer 770. Then, based on the data stored in data buffer 770, a data signal DLi is either activated or deactivated. For example, where memory cell Mi is one of target memory cells M3 and M5, data signal DLi is activated to a logic "high" level, and where the memory cell Mi is not one of target memory cells M3 and M5, data signal DLi is deactivated to a logic "low" level. Program driver 790 applies a program permission voltage to a bitline BLi where data signal DLi is activated and applies a program inhibition voltage to bitline BLi where data signal DLi is deactivated. In a program operation, a wordline voltage VWL applied to a selected wordline WLs is higher than a power supply voltage.

Sense amplifier 800 comprises precharge circuit 710, amplifier 730, and latch circuit 750, which perform a verification operation in a program mode and a reading operation in a read mode. Precharge circuit 710 comprises a precharge transistor PREM and a logic gate 711. Logic gate 711 generates a precharge signal PREi by performing logical operation on a bitline precharge signal BLPRE and an enable signal ENi. Precharge transistor PREM turns on or off in response to precharge signal PREi and applies or blocks a precharge voltage VPRE to bitline BLi. Where precharge transistor PREM is turned on, a current I1 flows to bitline BLi through precharge transistor PREM. In verification and read operations, amplifier 730 generates a sensing signal SNi by comparing a bitline voltage VBLi with a reference voltage VREF. For example, where bitline voltage VBLi is higher than reference voltage VREF, sensing signal SNi is activated to the logic high level, and where bitline voltage VBLi is lower than reference voltage VREF, sensing signal SNi is deactivated to the logic low level. Latch circuit 750 generates enable signal ENi in response to sensing signal SNi and a latch signal LAT.

Figure 6:
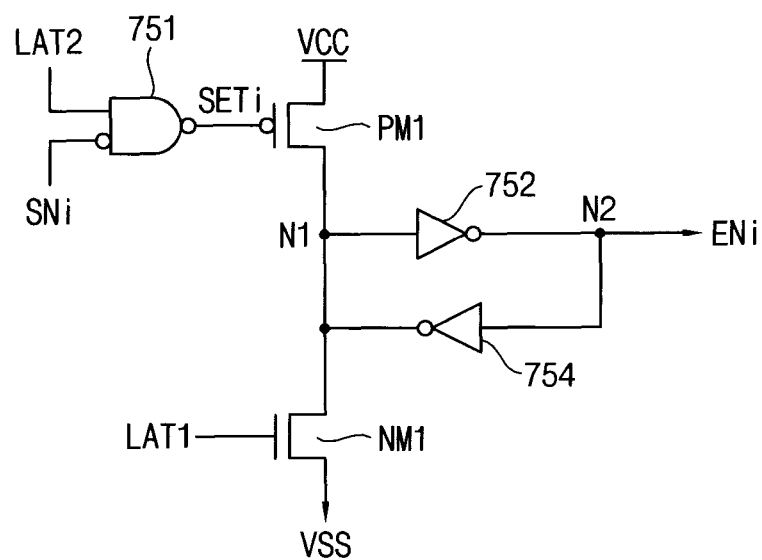
FIG. 6 is a circuit diagram illustrating an example of a latch circuit in the page buffer unit of FIG. 5.

FIG. 6 is a circuit diagram illustrating an example of a latch circuit in page buffer unit 700a of FIG. 5.

Referring to FIG. 6, a latch circuit 750a comprises a logic gate 751, a PMOS transistor PM1, an NMOS transistor NM1, a first inverter 752, and a second inverter 754.

NMOS transistor NM1 is coupled between a first node N1 and a ground voltage VSS, and it pulls down first node N1 to the logic low level in response to a first latch signal LAT1. Logic gate 751 generates a set signal SETi by performing logical operation on a second latch signal LAT2 and an inversion signal of a sensing signal SNi. PMOS transistor PM1 is coupled between a source voltage VCC and first node N1, and it pulls up first node N1 to the logic high level in response to set signal SETi. First inverter 752 and second inverter 754 are coupled in a latch structure between first node N1 and a second node N2. The latch structure generates enable signal ENi through second node N2.

Where NMOS transistor NM1 is turned on in response to first latch signal LAT1, enable signal ENi is activated to the logic high level. Where PMOS transistor PM2 is turned on in response to set signal SETi, enable signal ENi is deactivated to the logic low level. Where bitline precharge signal BLPRE is activated to the logic high level and enable signal ENi is also activated to the logic high level, the precharge signal PREi is activated to the logic low level and precharge transistor PREM is turned on. Then precharge voltage VPRE is applied to bitline BLi. On the other hand, where enable signal ENi is deactivated to the logic low level, precharge signal PREi is deactivated to the logic high level and precharge transistor PREM is turned off. Then precharge voltage VPRE is blocked from being applied to the bitline BLi. Accordingly, where sense amplifier 800 is activated, precharge voltage VPRE is applied to bitline BLi so that it can be determined whether memory cell Mi is an on-cell or an off-cell. Where sense amplifier 800 is deactivated, precharge voltage VPRE is blocked from being applied to bitline BLi.

Figure 7:
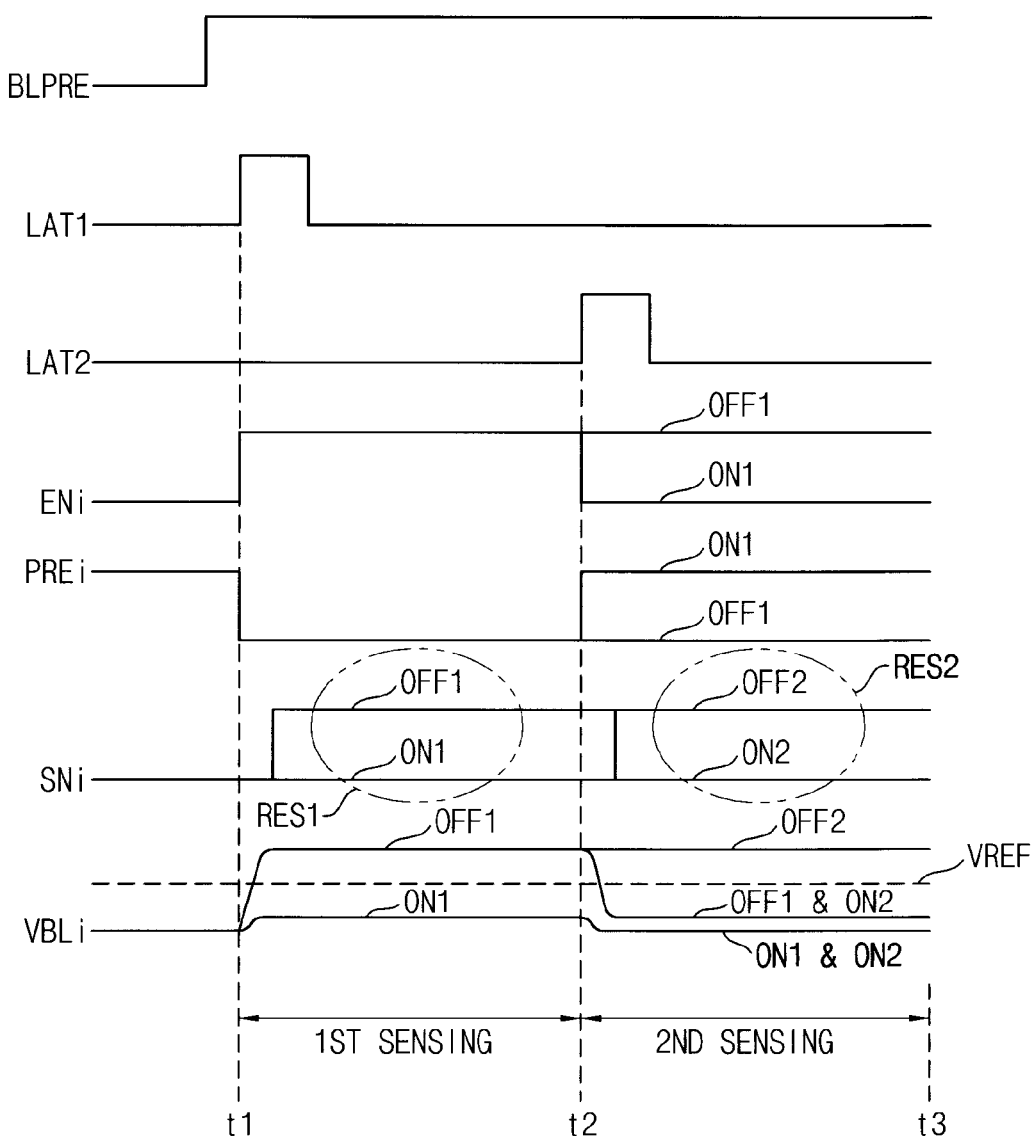
FIG. 7 is a timing diagram illustrating a sensing operation of the page buffer unit of FIG. 5.

FIG. 7 is a timing diagram illustrating a sensing operation of page buffer unit 700a of FIG. 5. In the example of FIG. 7, a bitline precharge signal BLPRE and latch signals LAT1, LAT2 are commonly applied to all of page buffer units 700a connected to bitlines BL1 through BL6. Signals ENi, PREi, SNi, and VBLi represented with the subscript "i" have logic levels that vary according to whether each memory cell Mi is an on-cell or an off-cell. First sensing operation is performed between a time t1 and a time t2, and second sensing operation is performed between time t2 and a time t3.

Referring to FIG. 7, a verification operation begins after a program operation upon activation of bitline precharge signal BLPRE to logic high level. In the verification operation, a verification voltage corresponding to a state to be verified is applied to selected wordline WLs as wordline voltage VWL. For example, where state S3 is to be verified, third verification voltage VVF3 is applied to selected wordline WLs.

At time t1, where first latch signal LAT1 is activated to the logic high level, an NMOS transistor NM1 of latch circuit 750a is turned on, and enable signal ENi is activated to the logic high level. Precharge signal PREi is activated to the logic low level and precharge transistor PREM is turned on. Consequently, precharge voltage VPRE is applied to bitline BLi. Because first latch signal LAT1 is commonly applied to all of sense amplifiers 800, first sensing operation is performed on all of a plurality of memory cells connected to selected wordline WLs.

While precharge voltage VPRE is applied to bitline BLi and sense amplifier 800 is activated, where the memory cell Mi is an on-cell, an on-current I2 flows into common source line CSL, which is grounded, and bitline voltage VBLi drops below reference voltage VREF. Consequently, sensing signal SNi is deactivated to the logic low level. On the other hand, where memory cell Mi is an off-cell, on-current I2 is blocked and bitline voltage VBLi remains higher than reference voltage VREF. Consequently, sensing signal SNi is activated to the logic high level.

In FIG. 7, a result RES1 of the first sensing operation is indicated as ON1 for on-cells and OFF1 for off-cells. The first sensing operation is performed by activating all of sense amplifiers 800 connected to bitlines BL1 through BL6 of memory cells M1 through M6, and it is determined whether each of the plurality of memory cells M1 through M6 is an on-cell or an off-cell based on the output of sense amplifiers 800 SN1 through SN6.

At time t2, where second latch signal LAT2 is activated to the logic high level, only the amplifiers connected to the bitlines of the off-cells are activated based on result RES1 of the first sensing operation. In other words, precharge transistor PREM is selectively turned on based on the logic level of each sensing signal SNi even though second latch signal LAT2 is activated with respect to all of the sense amplifiers.

Where sensing signal SNi has the logic low level ON1 as a result of the first sensing operation, indicating that memory cell Mi is an on-cell, set signal SETi is deactivated to the logic low level, and PMOS transistor PM1 of latch circuit 750a is turned on. Consequently, enable signal ENi is deactivated to the logic low level and precharge signal PREi is deactivated to the logic high level to turn off precharge transistor PREM. As a result, in the second sensing operation, sense amplifier 800 is deactivated and precharge voltage VPRE being applied to bitline BLi is blocked where it is determined based on the first sensing operation that memory cell Mi is an on-cell.

Where sensing signal SNi has the logic high level OFF1 as a result of the first sensing operation, indicating that memory cell Mi is an off-cell, set signal SETi is activated to the logic high level and PMOS transistor PM1 of latch circuit 750a is turned off. Consequently, enable signal ENi remains at the logic high level and precharge signal PREi is activated to the logic low level to turn on precharge transistor PREM. As a result, in the second sensing operation, amplifier 800 is activated and precharge voltage VPRE is applied to bitline BLi where it is determined based on the first sensing operation that memory cell Mi is an off-cell.

Where memory cell Mi is determined to be an off-cell in the first sensing operation and it is determined as an on-cell in the second sensing operation (OFF1 & ON2), on-current I2 flows through common source line CSL connected to ground, and bitline voltage VBLi drops below reference voltage VREF. Consequently, sensing signal SNi is deactivated to the logic low level. As indicated by the description of FIG. 4, a threshold voltage of a programmed memory cell such as memory cell Mi can be distributed within interval dV. On the other hand, where memory cell Mi is determined as an off-cell in the first sensing operation and determined as an off-cell again in the second sensing operation (OFF2), on-current I2 is blocked and bitline voltage VBLi remains higher than reference voltage VREF. As a result, sensing signal SNi remains at the logic high level. Where memory cell Mi is determined to be an on-cell in the first sensing operation and in the second sensing operation (ON1 & ON2), bitline voltage VBLi drops further below reference voltage VREF because memory cell Mi is turned on and precharge voltage VPRE is blocked.

As illustrated in FIG. 7, a result RES2 of the second sensing operation is represented as ON2 for on-cells and OFF2 for off-cells. The second sensing operation can be performed by activating only the sense amplifier connected to the bitline of an off-cell, and it can be determined whether target memory cells are completely programmed based on sensing signal SNi. Activating only the sense amplifier connected to the bitline of an off-cell is performed such that the precharge voltage is applied to the bitline of an off-cell and the precharge voltage is blocked from being applied to the bitline of an on-cell.

The second sensing operation is selectively performed where the first sensing operation determines that an off-cell exists among the target memory cells. Where the first sensing operation determines that all of the target memory cells are on-cells, the second sensing operation is not required, which can reduce the time required to perform a program operation.

Figure 8:
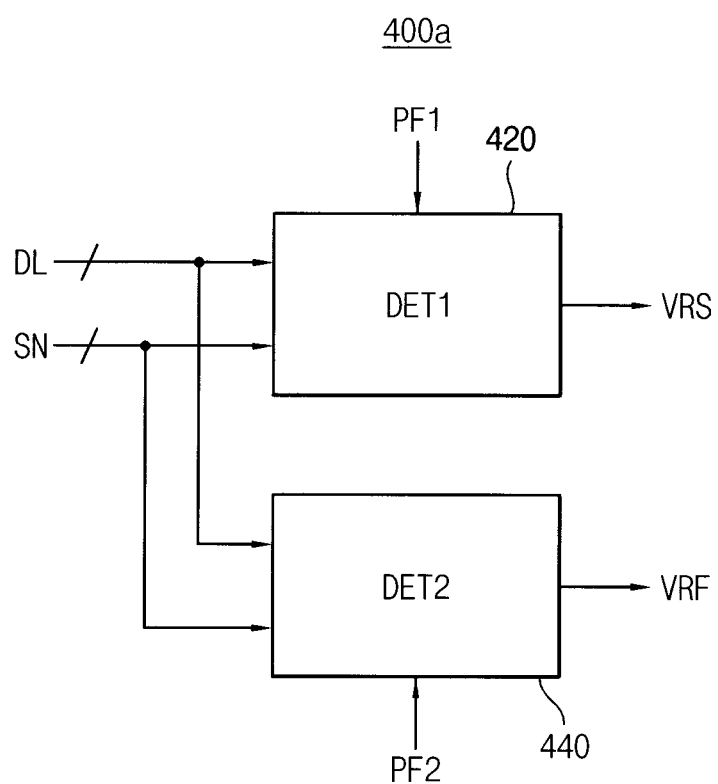
FIG. 8 is a block diagram illustrating a pass-fail detector in the nonvolatile memory device of FIG. 2.

FIG. 8 is a block diagram illustrating a pass-fail detector included in nonvolatile memory device 1000 of FIG. 2.

Referring to FIG. 8, pass-fail detector 400a comprises a first detector 420 and a second detector 440. First detector 420 generates a first detection signal VRS indicating whether an off-cell exists among target memory cells by performing a logical operation on a data signal DL corresponding to program data and a sensing signal SN corresponding to a result RES1 of the first sensing operation. Second detector 440 generates a second detection signal VRF indicating whether the target memory cells are completely programmed by performing logical operation on data signal DL corresponding to program data and sensing signal SN corresponding to one of result RES1 of first sensing operation or a result RES2 of the second sensing operation.

First detector 420 is activated in response to a first timing signal PF1 and second detector 440 is activated in response to a second timing signal PF2. Controller 500 activates first timing signal PF1 while sensing signal SN indicates result RES1 of the first sensing operation. Controller 500 skips the second sensing operation where first detection signal VRS indicates that an off-cell does not exist among the target memory cells, and activates second timing signal PF2 while sensing signal SN indicates result RES1 of the first sensing operation. Controller 500 performs the second sensing operation where first detection signal VRS indicates that an off-cell exists among the target memory cells, and activates second timing signal PF2 while sensing signal SN indicates result RES2 of the second sensing operation.

Figure 9:
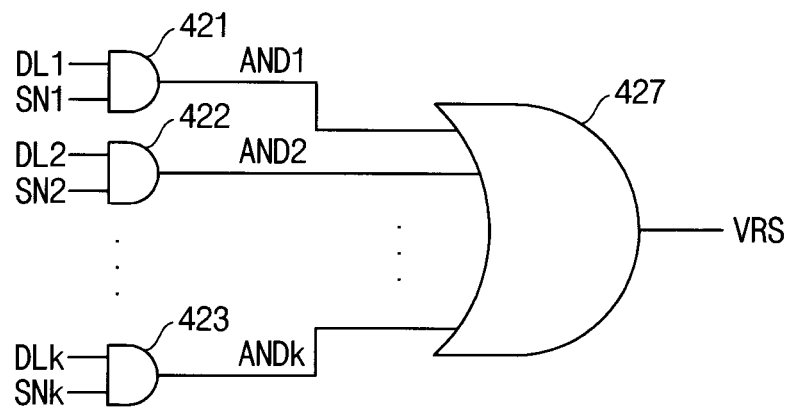
FIG. 9 is a circuit diagram illustrating an example of a first detector in the pass-fail detector of FIG. 8.

FIG. 9 is a circuit diagram illustrating an example of first detector 420 in pass-fail detector 400a of FIG. 8.

Referring to FIG. 9, a first detector 420a comprises a plurality of AND gates 421, 422 and 423, and an OR gate 427. AND gates 421, 422, and 423 output first logic signals AND1, AND2, and ANDk by performing logical operations on bits DL1, DL2, and DLk of a data signal DL and respective bits SN1, SN2, and SNk of a sensing signal SN. OR gate 427 outputs a first detection signal VRS by performing a logical operation on first logic signals AND1, AND2, and ANDk.

Each of bits DL1, DL2, and DLk of data signal DL with the logic high level indicates a target memory cell to be programmed, and each of these bits with the logic low level indicates a memory cell that is not a target memory cell. Each of bits SN1, SN2, and SNk of sensing signal SN with the logic high level indicates an off-cell, and each of these bits with the logic low level indicates an on-cell. Where at least one off-cell is found among the target memory cells based on the first sensing operation, first detection signal VRS is activated to the logic high level. Otherwise, first detection signal VRS is deactivated to the logic low level.

The configuration illustrated in FIG. 9 is only an example, and it can be modified in various ways depending on how logic levels of each signal are defined. As indicated by the foregoing, where at least one off-cell is found among the target memory cells based on the first sensing operation, first detection signal VRS is activated to a first logic level. Otherwise, first detection signal VRS is deactivated to a second logic level.

Figure 10:
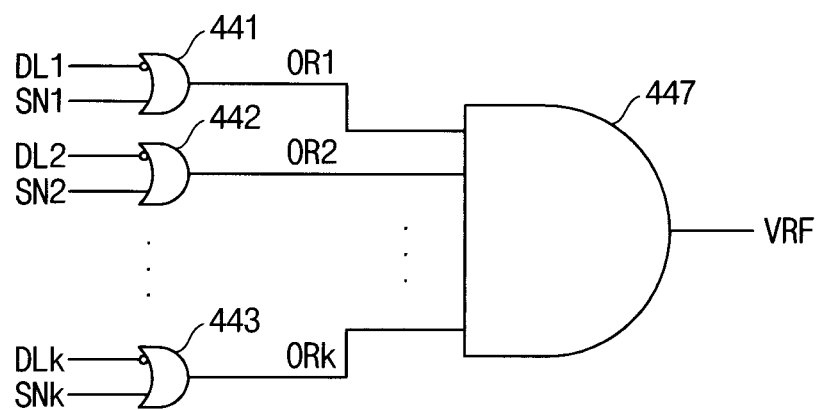
FIG. 10 is a circuit diagram illustrating an example of a second detector in the pass-fail detector of FIG. 8.

FIG. 10 is a circuit diagram illustrating an example of second detector 440 in pass-fail detector 400a of FIG. 8.

Referring to FIG. 10, a second detector 440a comprises a plurality of OR gates 441, 442, and 443, and an AND gate 447. OR gates 441, 442, and 443 output second logic signals OR1, OR2, and ORk by performing logical operations on inverted versions of bits DL1, DL2, and DLk of data signal DL, and bits SN1, SN2, and SNk of sensing signal SN, respectively. AND gate 447 outputs a second detection signal VRF by performing logical operations on second logic signals OR1, OR2, and ORk.

Each of bits DL1, DL2, and DLk of data signal DL in the logic high level indicates that a corresponding memory cell is a target memory cell to be programmed, and each of these bits in logic low level indicates that a corresponding memory cell is not a target memory cell. Also, each of bits SN1, SN2, and SNk of sensing signal SN in the logic high level indicates an off-cell, and each of these bits in the logic low level indicates an on-cell.

Second detection signal VRF is activated to the logic high level if all of the target memory cells are off-cells. Otherwise, second detection signal VRF is deactivated to the logic low level. The configuration illustrated in FIG. 10 is only an example, and it can be modified according to various factors such as how logic levels of each signal are defined.

Figure 11:
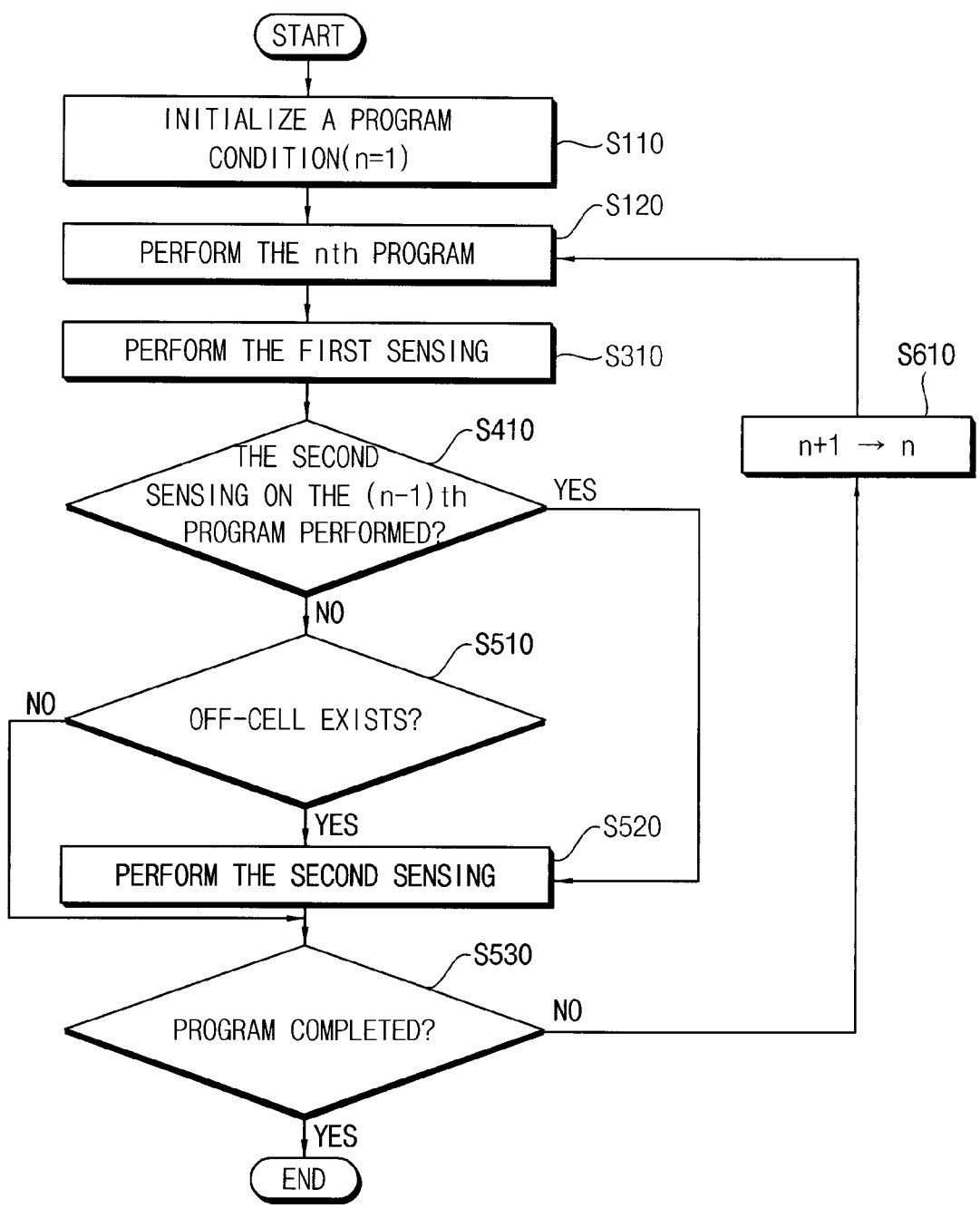
FIG. 11 is a flowchart illustrating a method of programming a nonvolatile memory device according to another embodiment of the inventive concept.
Figure 12:
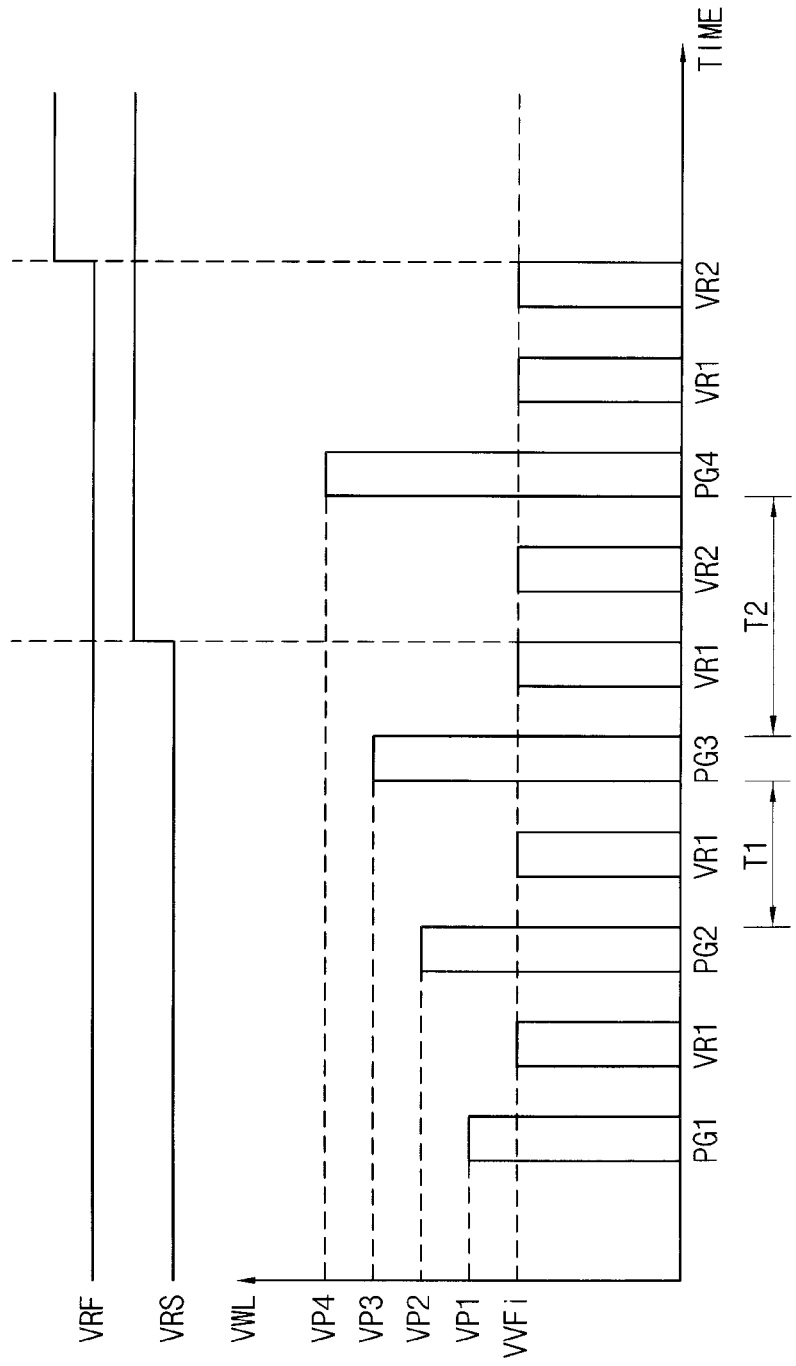
FIG. 12 is a timing diagram of a program operation performed according to the method of FIG. 11.

FIG. 11 is a flowchart illustrating a method of programming a nonvolatile memory device according to an embodiment of the inventive concept, and FIG. 12 is a timing diagram of a program operation performed according to the method of FIG. 11.

Referring to FIGS. 11 and 12, incremental step pulses are applied to the nonvolatile memory device as in step S100 of the method of FIG. 1. Steps S100, S300, and S500 of FIG. 1 are performed repeatedly in a plurality of program loops while increasing the magnitude of the step pulses in each successive program loop. These program loops are performed until a target state is reached for each memory cell to be programmed. In each program loop, step S300 determines whether an off-cell exists among target memory cells to be programmed. Step S500 is skipped within each loop where step S300 determines that there is no off-cell among the target memory cells.

Referring to FIG. 11, controller 500 initializes a program condition for a program operation (S110). Initializing the program condition can comprise, for instance, initializing a voltage control signal VCTRL so that a pulse voltage is at a start level. Target memory cells are programmed using an n-th pulse in an n-th program loop (S120). After the n-th pulse is applied to the target memory cells in the n-th program loop, first sensing operation is performed to determine whether each of a plurality of memory cells is an on-cell or an off-cell (S310).

Next, the method determines whether second sensing operation was performed in an (n−1)-th program loop (S410). Where second sensing operation was performed in an (n−1)-th program loop (S410=YES), the method performs second sensing operation again in the n-th program loop (S520). Otherwise, the method determines whether an off-cell exists in the n-th program loop (S510). Where an off-cell exists in the n-th program loop (S520=YES), the method performs second sensing operation in the n-th program loop (S520). Otherwise (S510=NO), the method skips the second sensing operation in the n-th program loop.

Following the second sensing operation, the method determines whether the target memory cells are completely programmed (S530). Where the target memory cells are not completely programmed (S530=NO), "n" is incremented (S610), and the method returns to step S120. Otherwise (S530=YES), the method terminates.

FIG. 12 illustrates an ISPP method in which a first sensing operation VR1 is performed and a second sensing operation VR2 is selectively performed with respect to each pulse while increasing a pulse voltage step-by-step. A first detection signal VRS based on first sensing operation VR1 indicates whether at least one off-cell exists among target memory cells. A second detection signal VRF indicates whether all of the target memory cells are completely programmed.

In program operations PG1, PG2, PG3, and PG4, respective pulse voltages VP1, VP2, VP3, and VP4 are applied to the target memory cells, and then first sensing operation VR1 is performed using a verify voltage VVFi. In the first sensing operation performed after program operations PG1 and PG2, no off-cell is detected among the target memory cells, so first detection signal VRS remains in the logic low level until first sensing operation VR1 is performed after program operation PG3. Because second sensing operation VR2 is skipped after program operations PG1 and PG2, a first verification time T1 is reduced compared with a second verification time T2 in which second sensing operation is performed.

Because at least one off-cell is found among the target memory cells based on a result of first sensing operation VR1 performed on third program PG3, first detection signal VRS is activated to the logic high level right after first sensing operation VR1 is performed after program operation PG3. Second sensing operation VR2 is performed to determine more accurately whether the target memory cells are completely programmed. Because it is determined based on a result of second sensing operation VR2 performed after program operation PG4 that all of the target memory cells are completely programmed, second detection signal VRF is activated to the logic high level right after second sensing operation VR2 is performed after program operation PG4.

Controller 500 determines, based on first detection signal VRS, whether second sensing operation should be performed. Controller 500 determines, based on second detection signal VRF, whether ISSP should be finished. The first sensing operation determines whether an off-cell exists among the target memory cells with respect to each pulse of the incremental step pulses, and the second sensing operation with respect to each pulse of the incremental step pulses is skipped until it is determined based on the result of the first sensing operation that the off-cell exists. Consequently, verification time may be reduced and performance of a nonvolatile memory device may be improved.

The above-described methods can be used in nonvolatile memory devices such as flash memory devices or resistive memory devices. Moreover, they can be used in nonvolatile memory devices where a plurality of memory cells is connected to a common source line, requiring more accurate verification.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming a nonvolatile memory device, comprising:
   programming target memory cells among a plurality of memory cells connected to a wordline, the plurality of memory cells including the target memory cells and other memory cells;
   performing a first sensing operation on both the target memory cells and the other memory cells of the plurality of memory cells; and
   after the first sensing operation and prior to any further programming of the target memory cells, selectively performing a second sensing operation on only the target memory cells of the plurality of memory cells based on a result of the first sensing operation.

2. The method of claim 1, wherein the first sensing operation determines whether each of the plurality of memory cells is an on-cell or an off-cell.

3. The method of claim 2, wherein the second sensing operation determines whether all of the target memory cells are completely programmed.

4. The method of claim 1, wherein the programming target memory cells, first sensing operation and second sensing operation are carried out in sequence within each of a plurality of program loops,
   wherein the second sensing operation is skipped in each program loop in which it is determined, based on the result of the first sensing operation, that no off-cell exists among the target memory cells, and
   the second sensing operation is performed in each program loop in which it is determined, based on the result of the first sensing operation, that at least one off-cell exists among the target memory cells.

5. The method of claim 1, wherein the first sensing operation is performed on all of the plurality of memory cells, and the second sensing operation is performed only on memory cells that are identified as off-cells in the first sensing operation.

6. The method of claim 1, wherein performing the first sensing operation comprises:
   activating a plurality of sense amplifiers connected to the plurality of memory cells; and
   determining whether each of the plurality of memory cells is the on-cell or the off-cell based on signals output by the sense amplifiers.

7. The method of claim 1, wherein selectively performing the second sensing operation comprises:
   determining whether at least one off-cell exists among the plurality of target memory cells based on the result of the first sensing operation.

8. The method of claim 7, wherein selectively performing the second sensing operation further comprises:
   activating a sense amplifier connected to the at least one off-cell as a consequence of determining, based on the result of the first sensing operation, that the at least one off-cell exists among the target memory cells; and determining whether the target memory cells are completely programmed based on signals output by sense amplifiers connected to the target memory cells.

9. The method of claim 8, wherein activating the sense amplifier connected to the at least one off-cell comprises:

applying a precharge voltage to a bitline connected to the at least one off-cell; and blocking the precharge voltage from being applied to bitlines connected to on-cells.

10. The method of claim 7, wherein selectively performing the second sensing operation further comprises:

skipping the second sensing operation and determining whether the target memory cells are completely programmed as a consequence of determining, based on the result of the first sensing operation, that no off-cell exists among the target memory cells.

11. The method of claim 1, the target memory cells are programmed using incremental step pulse programming (ISPP).

12. The method of claim 11, wherein the first sensing operation determines whether at least one off-cell exists among the target memory cells in program loops of the ISPP, and the second sensing operation is skipped in each program loop until the first sensing operation determines that at least one off-cell exists among the target memory cells.

13. A method of programming a nonvolatile memory device, comprising:

programming target memory cells among a plurality of memory cells connected to a wordline;

performing a first sensing operation on the plurality of memory cells; and selectively performing a second sensing operation on the target memory cells based on a result of the first sensing operation, wherein selectively performing the second sensing operation comprises:

generating a first detection signal by performing logical operation on program data and the result of the first sensing operation, the first detection signal indicating whether at least one off-cell exists among the target memory cells.

14. The method of claim 13, wherein selectively performing the second sensing operation further comprises:

activating a sense amplifier connected to the at least one off-cell where the first detection signal is activated to a first logic level; and generating a second detection signal by performing logical operation on the program data and outputs of sense amplifiers connected to the plurality of memory cells, the second detection signal indicating whether the target memory cells are completely programmed.

15. The method of claim 13, wherein selectively performing the second sensing operation further comprises:

where the first detection signal is deactivated to a second logic level, skipping the second sensing operation and generating a second detection signal by performing a logical operation on the program data and outputs of sense amplifiers connected to the plurality of memory cells, the second detection signal indicating whether the target memory cells are completely programmed.

16. The method of claim 1, wherein the plurality of memory cells are connected to a common source line.

17. The method of claim 1, wherein the plurality of memory cells comprises NOR flash memory cells.

18. A method of programming target memory cells among memory cells including the target memory cells and other memory cells connected to a selected wordline in a nonvolatile memory device, comprising:

performing a plurality of program loops each comprising applying a program pulse to the target memory cells and the other memory cells via the selected wordline, performing a first program verification operation to verify program states of the target memory cells and the other memory cells connected to the selected wordline, and selectively performing a second program verification operation to verify program states of the target memory cells connected to the selected wordline, wherein, within at least one program loop, the second program verification operation is performed after first program verification operation without an intervening program pulse application to the target memory cells, and wherein, within at least one program loop, the second program verification operation is performed as a consequence of determining, in the first program verification operation, that at least one off-cell exists among the target memory cells.

19. The method of claim 18, wherein the target memory cells are multi-level cells and the nonvolatile memory device is a NAND flash memory device.

20. The method of claim 18, wherein the plurality of memory cells comprises a page of memory cells, and the target memory cells comprise memory cells to be programmed to a predetermined program state.

* * * * *